United States Patent [19]
Eckels

[11] Patent Number: 6,029,458
[45] Date of Patent: Feb. 29, 2000

[54] HELIUM RECONDENSING MAGNETIC RESONANCE IMAGER SUPERCONDUCTING SHIELD

[76] Inventor: Phillip William Eckels, 3322 Ebenezer Chase Dr., Florence, S.C. 29501-8006

[21] Appl. No.: 09/074,332

[22] Filed: May 7, 1998

[51] Int. Cl.[7] .............................. F17C 5/02; H01F 7/22; F25B 19/00
[52] U.S. Cl. ........................ 62/47.1; 62/51.1; 335/301
[58] Field of Search .............................. 62/6, 47.1, 51.1; 335/301

[56] References Cited

U.S. PATENT DOCUMENTS

| | | | |
|---|---|---|---|
| 5,258,573 | 11/1993 | Sugioka et al. | 505/211 |
| 5,373,275 | 12/1994 | Itoh et al. | 335/216 |
| 5,447,033 | 9/1995 | Nagao et al. | 62/6 |
| 5,613,367 | 3/1997 | Chen | 62/47.1 |
| 5,701,744 | 12/1997 | Eckels et al. | 62/47.1 |

*Primary Examiner*—William Doerrler
*Attorney, Agent, or Firm*—Irving M. Freedman; Christian G. Cabou; Phyllis Y. Price

[57] ABSTRACT

A cryogen recondensing magnetic resonance imager superconducting magnet utilizing a rare earth displacement material cryocooler with a superconducting sleeve surrounding a portion of the circumference of the cold end of the cryocooler to provide superconducting current flow of currents induced by movement of the rare earth displacer to generate opposing magnetic fields which shield the imaging region of the superconducting magnet from magnetic interference generated by movement of the cryocooler rare earth displacer.

12 Claims, 2 Drawing Sheets

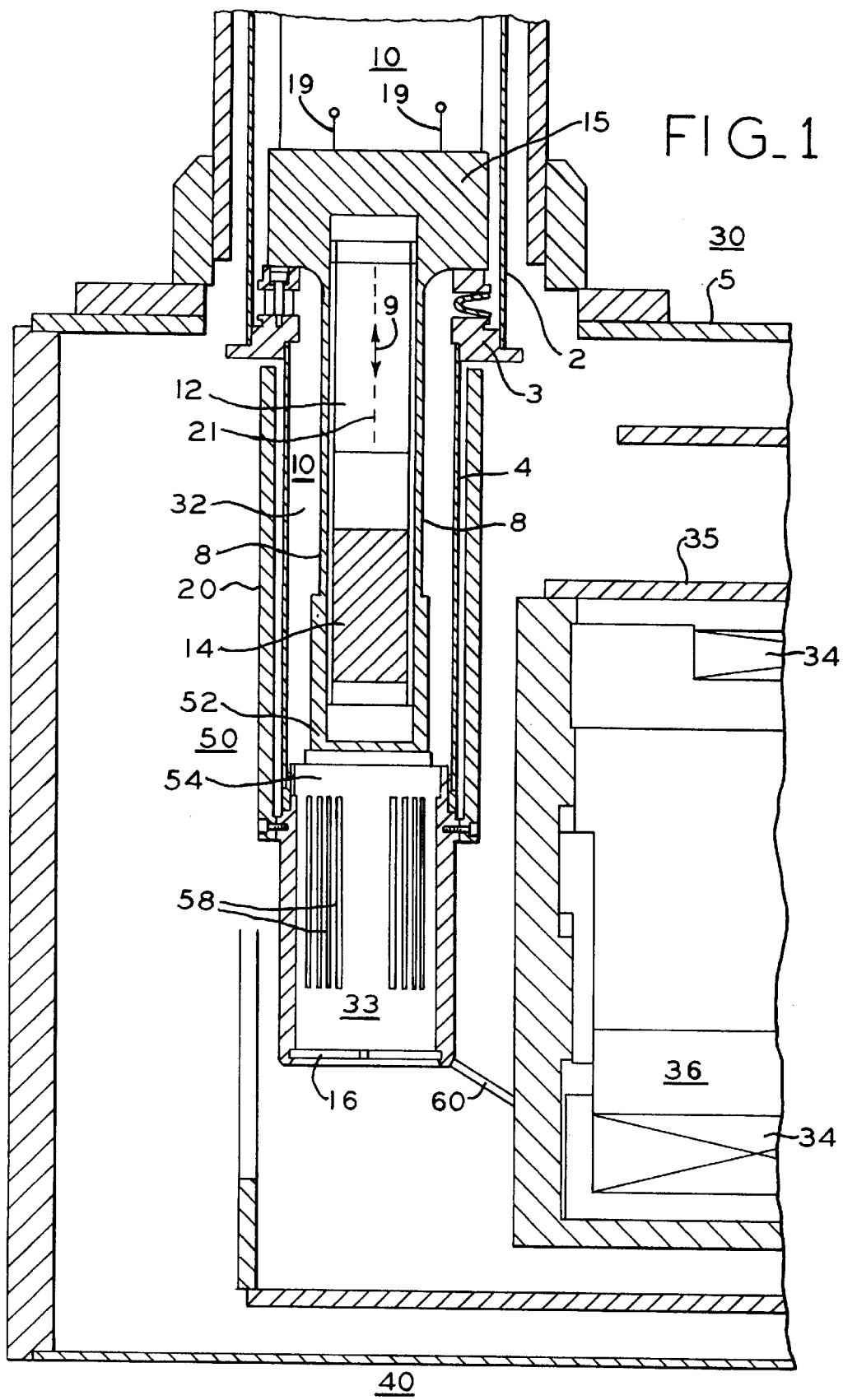
FIG_1

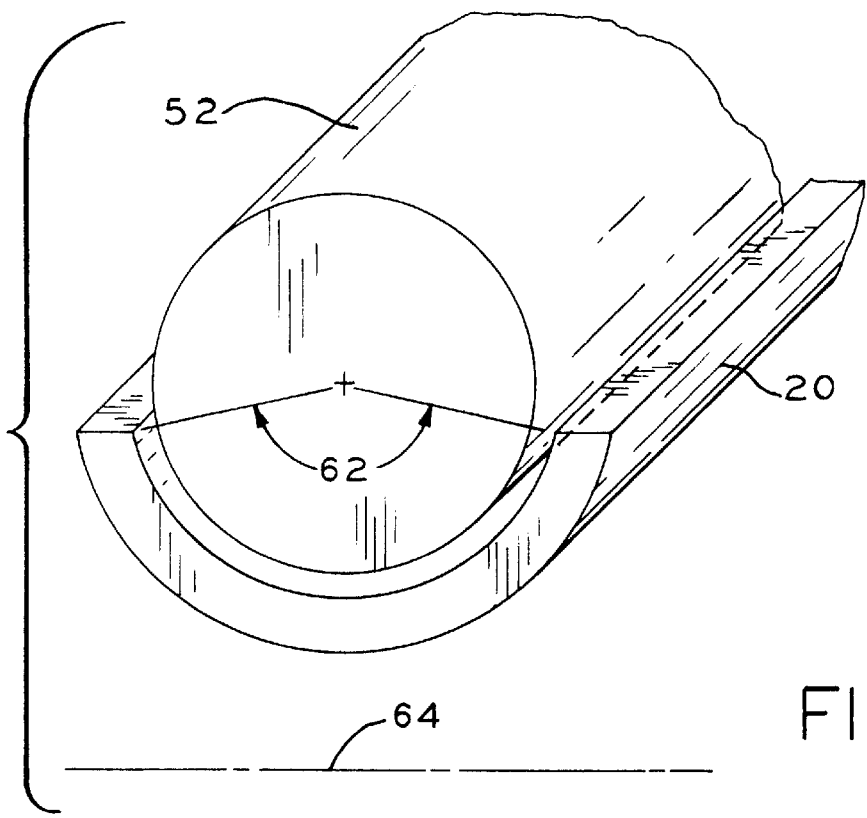
FIG_2
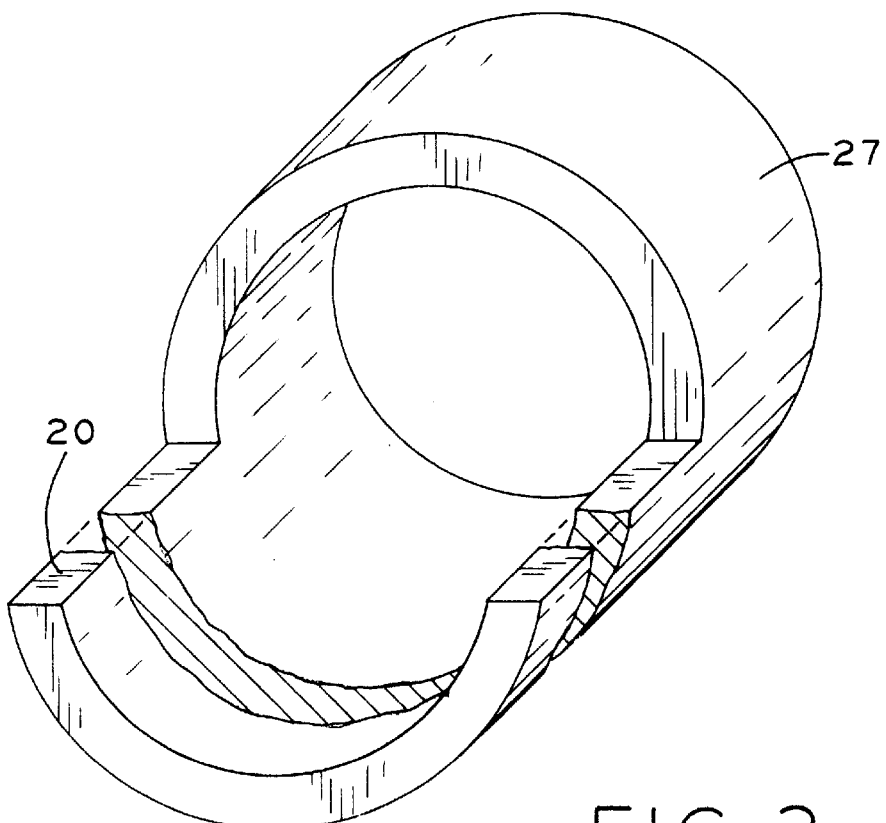
FIG_3

HELIUM RECONDENSING MAGNETIC RESONANCE IMAGER SUPERCONDUCTING SHIELD

BACKGROUND OF INVENTION

As is well known, a magnet coil can be made superconducting by placing it in an extremely cold environment, such as by enclosing it in a cryostat or pressure vessel and reducing its temperature to superconducting levels such as 4–10° Kelvin. The extreme cold reduces the resistance of the magnet coil to negligible levels, such that when a power source is initially connected to the coil for a period of time to introduce a current flow through the coil, the current will continue to flow through the coil due to the negligible coil resistance at superconducting temperatures even after power is removed, thereby maintaining a strong, steady magnetic field. Superconducting magnets find wide application, for example, in the field of magnetic resonance imaging (hereinafter "MRI").

In a typical MRI magnet, the main superconducting magnet coils are enclosed in a cylindrically shaped pressure vessel which is contained within an evacuated vessel and forms an imaging bore in the central region. The main magnet coils develop a strong magnetic field in the imaging bore which must be very homogenous and temporally constant for accurate imaging.

Superconducting temperatures are commonly obtained by boiling a liquid cryogen such as liquid helium within the pressure vessel. While the use of liquid helium to provide cryogenic temperatures is widely practiced and is satisfactory for MRI operation, the provision of a steady supply of liquid helium to MRI installations all over the world and its storage and use has proved to be difficult and costly. As a result, considerable effort has been directed at the use of mechanical displacement type cryocoolers or conduction cooling for recondensing the helium gas resulting from the boiling, and then recycling the condensed helium.

However, the ability of mechanical cryocoolers such as the Gifford-McMahon type, to provide the necessary amount and required degree of cooling has often been marginal. As a result, it is highly desirable to minimize the load on the cryocooler and to maximize the capacity of the cryocooler to the extent practical. One type of cryocooler that has desirable cooling capacity uses rare earth materials as the displacement material in the moving piston of the compressor for the second or cold stage of a two stage cryocooler. The rare earth materials such as $Er_3Ni$, $HoCu_2$, or ErNiCo produces relatively high heat capacity in the superconducting temperature range of 4–10° K due to magnetic transitions to enable low temperature operation.

However, cryocoolers utilizing ferromagnetic transition rare earth materials in MRI applications can cause significant distortions and perturbations of the magnetic field in the MRI imaging volume. The rare earth material in the moving displacer is believed to act as a moving magnet of variable field strength when it becomes magnetized by the local field of a typical superconductive magnet, in turn causing magnetic field fluctuations in the imaging volume of the superconductive magnet, which creates unacceptable distortions in the images rendered.

The time varying magnetic fields generated by the moving rare earth displacer can also induce eddy currents in various metallic structures of the main magnet assembly and in the main magnet coils. The presence of eddy currents is most undesirable in MRI applications of rare earth cryocoolers since such eddy currents will generate heat due to the finite electrical resistance of the structures and coils involved. This is the so called AC heating effects of eddy currents which is an additional thermal burden in providing adequate cooling in systems utilizing cryocoolers.

While magnetic shielding arrangements have been used in MRI equipment including bucking coils, and copper and superconducting shields, image quality and other problems discussed above have hindered the commercial use of rare earth cryocoolers in MRI equipment. While superconducting shields have been proposed to surround and shield rare earth cryocoolers, such shields have proven to add considerable cost and weight to the extent that removal of such a cryocooler with an attached shield from an MRI magnet is difficult for one person to physically accomplish. In addition, such shields produce measurable heating due to hystersis and eddy current losses induced by the changing fields, and consume an undesirable fraction of the available low temperature cooling capacity.

SUMMARY OF THE INVENTION

Thus, there is a particular need for an improved rare-earth cryocooler assembly with a superconductive shield which avoids the aforementioned problems yet which enables a homogenous temporally constant imaging field.

In accordance with one form of the present invention, a mechanical displacement rare-earth cryocooler provides cooling for condensing and recycling boiled helium in superconducting recondensing operation of an MRI magnet. A magnetic superconducting shielding sleeve surrounds a portion of the rare-earth displacer in the terminal portion of the cryocooler housing. The shielding sleeve is in close proximity to the cold head of the cryocooler, is magnetically coupled to the magnetic fields generated by movement of the rare-earth displacer, and surrounds 90–270 degrees of the cold head to which it is thermally coupled. Superconducting flow of the currents induced in the shield by the magnetic fields generated by magnetization and movement of the rare-earth displacers oppose the induced magnetic fields and shield the MRI imaging volume from the temporal and spacially varying magnetic fields generated by movement of the rare-earth displacer. More particularly, the superconducting sleeve shield includes layers of copper and NbTi alloy and is interposed between the cold head and the imaging region in the bore of the magnet.

BRIEF DESCRIPTION OF THE DRAWINGS

The features of the invention believed to be novel are set forth with particularly in the appended claims. The invention itself, however, together with further advantages thereof, may best be understood by reference to the following description in conjunction with the accompanying drawings in which like characters represent like parts throughout the drawings, and in which:

FIG. 1 is a simplified cross-sectional view of a rare earth cryocooler and cryostat penetration area for a zero boiloff MRI cryogen recondensing superconducting magnet in accordance with this invention.

FIG. 2 shows details of the superconducting sleeve of FIG. 1 in a contacting configuration with the cryocooler cold head.

FIG. 3 is an enlarged perspective view of the superconducting sleeve shown in FIGS. 1 and 2.

DETAILED DESCRIPTION OF THE INVENTION

Referring to FIG. 1, two-stage cryocooler 10 includes a housing 8 forming an internal cylindrical bore 12 in which second stage displacer 14 driven by drive motor 15 through mechanical drive 21 (shown in simplified form) reciprocates as indicated by arrow 9. Second stage displacer 14 is a rare-earth material such as ErNiCo utilized in cryocoolers such as those sold by Sumitomo Heavy Industries under their coldhead model designation RDK-408.

Cryocooler 10 is inserted into sealed and evacuated cavity 32 within evacuated vessel 5 formed by sleeve walls 2 and 4 and intermediate collar 3 within MRI superconducting magnet 30. In operation, the rare-earth materials of second stage displacer 14 have relatively high heat capacity in the 4–10 K range due to magnetic transitions enabling cryocooler 10 to reduce the temperature of cryogen recondensing apparatus 33 to which it is thermally connected to superconducting temperatures. The thermal connection is made through separable thermal joint 50 which includes copper thermal member or cold head 52 on cryocooler 10 and copper thermal member 54 within MRI magnet 30 and forming the bottom surface of cavity 32. This enables the removal and replacement of cryocooler 10 without breaking the vacuum within vacuum vessel 5 of superconducting magnet 30 or discontinuing superconducting operation of the magnet.

The recondensing and recycling of the boiled cryogen, typically helium gas, results from the boiling of liquid helium from helium cryogen reservoir 36 within pressurized vessel 35 to cool main magnet coils such as 34 to superconducting temperatures. The helium gas is passed between parallel recondensing surfaces 58 in recondenser 33 to be recondensed to liquid helium which collects at bottom 16 of the recondenser and flows by gravity via return line 60 to be returned as liquid helium to the liquid helium reservoir 36 within pressurized vessel 35 of MRI superconducting magnet 30. The result is a zero boiloff (ZBO) closed loop helium boiling and recondensing system without the need to replenish the boiled helium by periodic additions from an external source of liquid helium. The cooled recondensing surfaces 58 are formed by slots in thermal member 54, or plates in recondenser 33, between which the helium gas flows to be recondensed.

Displacer 14 is driven at a constant frequency and amplitude along axis 9 by the drive motor 15 supplied by electrical power at terminals 19. It is believed that the rare-earth material in the moving displacer acts as a moving magnet of varying strength (magnetic moment) generating strong varying magnetic fields which can interact with the magnetic fields produced by main magnet coils 34 and associated coils (not shown) of MRI superconducting magnet 30 causing magnetic field fluctuations in the imaging region or bore 40 of the superconducting magnet. The magnetic field generated by the moving second stage displacer 14 must accordingly, be minimized and/or prevented from interfering with the magnetic homogeneity within central imaging bore or volume 40 in order to avoid distortions in the imaging quality if the rare earth cryocooler 10 is to be suitable and practical for use in MRI imaging.

Superconducting sleeve 20 is fitted around cavity 32 in the region surrounding second stage displacer 14 of the second or cold stage of cryocooler 10. Superconductive sleeve 20 may be of a lead bismuth alloy (60 parts lead and 40 parts, by weight, bismuth) which has proven to exhibit desirable limiting current characteristics in the event of a quenching, or discontinuing superconducting operation, of superconducting magnet 30. Such a shield can provide shielding that reduce AC magnetic fields by an order of 100.

Referring next to FIGS. 2 and 3, it is seen that superconducting shield 20 is attached to and contacts coldhead 52 at one end to surround the rare earth material displacer 14 (see FIG. 1). Superconducting shield 20 in FIG. 1 does not physically contact cold head 52 but does closely surround the cold head in thermal contact with the cold head. Superconducting shield 20 is a partial cylinder surrounding a portion of cold head 52 as indicated by angle 62, which angle may be approximately 270° and vary from approximately 90°–270° around the circumference of the cold head. Superconducting shield 20 is thus positioned on or around cold head 52 and interposed between the cryocooler and axis 64 of bore 40 of superconducting magnet 30, that is between cryocooler 10 and the MRI imaging region within bore 40 to shield the magnetic field in the imaging region from magnetic perturbations generated by rare earth cryocooler 10. As shown in FIG. 3, superconducting shield 20 may include a cylindrical collar portion 27 at the end closest to motor 15. Collar portion 27 fully encircles cryocooler 12 and assists in securing the collar to the cryocooler.

While superconducting or superconductive shield 20 is not a continuous cylindrical superconducting sheet, it nevertheless can contain and maintain a large number of superconducting loops to enable continuous generation of the magnetic fields induced to shield main magnet field coils 34 of MRI superconducting magnet 30 from the magnetic field perturbations of cryocooler 10 and prevent them from adversely affecting the magnetic field within imaging volume 40 (see FIG. 1) of the MRI magnet bore. This enables main magnet coils 34 and associated coils (not shown) to provide the desired and necessary field homogeneity and stability without undue magnetic interference from cryocooler 10 rare earth second stage displacer 14. Moreover, the magnetic fields induced in shield 20 oppose and thus limit eddy current flows and heating in the structural members of superconducting magnet 30.

Sleeve 20 in the embodiment of FIG. 2 fits snugly around the cylindrical outer surface of housing 52 of cryocooler 10 using thermal grease which is vacuum grease including copper powder or solder to provide good thermal contact and magnetic coupling with second stage displacer 14 of the cryocooler. Sleeve 20 is then soldered in place. Sleeve 20 is 6.25 inches long, 2 inches in diameter and 0.13 inches thick for one MRI superconducting magnet.

The insertion and removal of cryocooler 10 including its attached drive motor 15 and associated components along with superconducting shield 20 has proven to be difficult for a single person to readily accomplish in the field. The assembly can weigh up to 40 pounds in magnets 30 in which superconducting sleeve 20 is fit around and retained on cold head cryocooler 10 for removal with the cryocooler. As a result, reduction in weight of sleeve 20 when removing the sleeve along with cryocooler 10 can be significant and highly desirable.

Moreover, the full cylindrical superconducting sleeve 20 can cost as much as $2,000, such that the partial sleeve can also significantly reduce costs of the sleeve and MRI 30.

More important, superconducting sleeve 20 closely surrounding the cold head of cryocooler 10 is less of a cryogenic heat load on the cryocooler than a full cylindrical sheild would be. This is of particular significance because mechanical cryocoolers are often operating at or near their full capacity and any reduction in thermal loading assists in enabling effective and reliable superconducting operation.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A mechanical cryocooler cryogen recondensing zero-boiloff system utilizing a rare earth displacer for a magnetic resonance imager superconducting magnet comprising:

a recondenser;

said cryocooler thermally connected to said recondenser;

a superconducting sleeve closely and partially surrounding said cryocooler rare earth displacer;

said sleeve being magnetically coupled to the magnetic fields generated by the movement of said rare earth displacer to provide superconducting flow of currents induced in said shield by said magnetic fields;

said superconducting magnet including a closed cavity to receive said cryocooler; and said sleeve is secured to said cryocooler for insertion therewith into said cavity and for removal therefrom;

said superconducting flow of currents generating magnetic fields opposing said induced magnet fields to shield said superconducting magnet imaging volume from said magnetic fields generated by said movement of said rare earth displacer.

2. The cryogen recondensing superconducting magnet of claim 1 wherein said superconducting sleeve surrounds approximately 90°–270° of the circumference of said rare earth displacer of said cryocooler.

3. The cryogen recondensing superconducting magnet of claim 2 wherein said cryocooler includes a cold head around said displacer and said sleeve substantially contacts said cold head of said cryocooler.

4. The cryogen recondensing superconducting magnet of claim 3 wherein said superconducting magnet includes a closed cavity therein and said cryocooler and said cryocooler are positioned within said cavity and said superconducting sleeve is secured to said cold head and is removable therewith.

5. The cryogen recondensing superconducting magnet of claim 2 wherein said sleeve is layered copper and NbTi alloy.

6. The cryogen recondensing superconducting magnet of claim 2 wherein said superconducting magnet provides an imaging region in the central area thereof and said superconducting sleeve is positioned between said rare earth displacer and said imaging region.

7. The cryogen recondensing superconducting magnet of claim 6 wherein said superconducting sleeve surrounds appoximately 270 degrees of the circumference of the cold head of said cryocooler.

8. The cryogen recondensing superconducting magnet of claim 6 wherein magnetic fields induced in said superconducting sleeve by said rare earth displacer oppose and cancel magnetic disturbances which would otherwise adversely affect the homogeneity of the magnetic field in said imaging region.

9. The cryogen recondensing superconducting magnet of claim 8 wherein said sleeve is layered copper and NbTi alloy.

10. The cryogen recondensing superconducting magnet of claim 9 wherein said superconducting sleeve includes a circumferential collar adjacent one end thereof for securing said superconducting sleeve to said cryocooler.

11. The cryogen recondensing superconducting magnet of claim 10 wherein said one end is remote from said recondenser.

12. The cryogen recondensing superconducting magnet of claim 9 wherein said superconducting sleeve is approximately 2 inches in diameter and in excess of approximately 6.25 inches long.

* * * * *